(12) United States Patent
Kobayashi et al.

(10) Patent No.: US 7,798,195 B2
(45) Date of Patent: Sep. 21, 2010

(54) SUCTION UNIT

(75) Inventors: Kenji Kobayashi, Tokyo (JP); Masaki Tsujimoto, Tokyo (JP); Takahisa Yoshioka, Tokyo (JP)

(73) Assignee: Lintec Corporation, Tokyo (JP)

( * ) Notice: Subject to any disclaimer, the term of this patent is extended or adjusted under 35 U.S.C. 154(b) by 729 days.

(21) Appl. No.: 11/578,990

(22) PCT Filed: Apr. 20, 2005

(86) PCT No.: PCT/JP2005/007500

§ 371 (c)(1),
(2), (4) Date: Oct. 19, 2006

(87) PCT Pub. No.: WO2005/104201

PCT Pub. Date: Nov. 3, 2005

(65) Prior Publication Data

US 2007/0169895 A1 Jul. 26, 2007

(30) Foreign Application Priority Data

Apr. 23, 2004 (JP) ............................ 2004-128124

(51) Int. Cl.
*B32B 38/10* (2006.01)
*B32B 11/00* (2006.01)

(52) U.S. Cl. ..................... 156/584; 156/344; 269/21; 248/363

(58) Field of Classification Search .................. 156/344, 156/584; 269/21; 248/363
See application file for complete search history.

(56) References Cited

U.S. PATENT DOCUMENTS

| | | | | |
|---|---|---|---|---|
| 5,180,000 A | * | 1/1993 | Wagner et al. | 165/80.1 |
| 6,767,426 B1 | * | 7/2004 | Yamamoto | 156/270 |
| 2005/0126694 A1 | * | 6/2005 | Yamamoto | 156/247 |

FOREIGN PATENT DOCUMENTS

| | | |
|---|---|---|
| JP | 59-30631 A | 2/1984 |
| JP | 2001-319906 A | 11/2001 |
| JP | 2003-173996 A | 6/2003 |

* cited by examiner

*Primary Examiner*—Mark A Osele
(74) *Attorney, Agent, or Firm*—Westerman, Hattori, Daniels & Adrian, LLP

(57) ABSTRACT

A wafer W is supported on the rear surface side thereof by a ring frame R by means of a dicing tape T, and a protection tape H is stuck on the front surface side the wafer W. A suction unit 12 includes a table 16 having a suction face 15 in the upper face. The suction face 15 sucks the dicing tape T to hold the wafer W through performing a predetermined suction. At least in a partial area along the periphery of the suction face 15, a groove 24 is formed. By sucking through the suction face 15, the inside of the groove 24 becomes negative pressure and the dicing tape T is sunk therein.

5 Claims, 9 Drawing Sheets

SUCTION UNIT

TECHNICAL FIELD

The present invention relates to a suction unit for holding a plate-like member stuck with an adhesive sheet on one surface, further in particular, to a suction unit capable of peeling off easily and swiftly the protection tape stuck on the other surface of the plate-like member.

BACKGROUND ART

Conventionaly, a substantially disk-like semiconductor wafer (hereinafter, simply referred to as "wafer") of which front surface side is the circuit plane is known. Generally, the thickness of the wafer is controlled by grinding the rear surface side with a grinder or the like after sticking a protection tape on the circuit plane. Then, in a state that the rear surface side of the wafer is stuck to the adhesive face side of a dicing tape exposed within the inner side of the ring frame, the protection tape is peeled off from the front surface side of the wafer. And after that, the wafer is cut into a dice shape; thus, the semiconductor chip is formed.

As an apparatus for peeling off the protection tape from the wafer, such an apparatus as a type shown in FIG. 12 is known. The apparatus includes a suction unit 51 to hold the wafer W through sucking the dicing tape T on the upper face side as a suction face 50, and a peeling unit 53, which peels off the protection tape H of the wafer W held by the suction unit 51. The peeling unit 53 includes a roller 54 on which a strip-shaped peeling tape P, which is paid out between an unshown supply reel and a winding reel, is laid around. And it is arranged so that, after sticking the peeling tape P to the periphery edge of the protection tape H via the roller 54, by rotating the roller 54 along the radial direction of the protection tape H while winding the peeling tape P, the protection tape H is peeled off from the wafer W.

There resides the following problem in the above-mentioned apparatus. That is, as shown in FIG. 12, when the peeling tape P is stuck on the periphery edge of the protection tape H, the peeling tape P and the dicing tape T are stuck to each other by the elastically deformed roller 54. When peeling off the protection tape H is started in that state, the wafer W is damaged.

As an apparatus to solve the above problem, for example, such a type of apparatus as disclosed in patent document 1 is known. Referring to the document, a mask plate is provided in the vicinity of the suction unit, which can cover the adhesive face side (upper face side) of the dicing tape. When sticking the peeling tape to the periphery edge of the protection tape via the roller, the mask plate prevents the peeling tape from adhering to the dicing tape, and before and after peeling the protection tape, the mask plate can rotate from an area above the suction unit to an escaping position.

[Patent document 1] Japanese Patent Application Laid-Open No. 2001-319906

DISCLOSURE OF THE INVENTION

Problems to be Solved by the Invention

However, in the arrangement of the patent document 1, there reside such disadvantages that the number of parts for moving arrangement of the mask plate increases, resulting in complication of the apparatus. Moreover, every replacement occasion of the wafer on the suction face requires to move the mask plate for covering the dicing tape, and to retreat the mask plate outside of the suction unit. Thus, such a disadvantage is resulted that necessary time for peeling process of the protection tape becomes longer.

Another arrangement as described below is also known. That is, a lifter for raising the wafer from the ring frame is used; and thereby, the dicing tape is maintained in an inclined posture to prevent the peeling tape and the protection tape from adhering to each other. In this apparatus also, there reside such disadvantages that the raising operation of the wafer causes complication of the lifter and increase of peeling process time due to lifting operation.

Object of the Invention

The present invention has been proposed in view of the above disadvantages. An object of the present invention is to provide a suction unit that can simplify the apparatus, and can peel off the protection tape swiftly and smoothly in the operation of peeling off the tape stuck to a plate-like member.

Means for Solving the Problems

To achieve the object, the present invention adopts following arrangement; a suction unit to hold a plate-like member by sucking an adhesive sheet, which is provided with a plain area protruded outside of the periphery of the plate-like member and one face of the plate-like member is stuck to the adhesive sheet, comprising:

a table having a suction face for sucking the adhesive sheet by performing a predetermined suction, and a groove that is formed at least in a partial area along the periphery of the plate-like member.

The present invention preferably adopts such an arrangement that the table includes a table body having an area positioned on a surface substantially identical to the suction face and a suction member provided within the area of the table body to form the suction face, the suction face has a plane shape corresponding to the plane shape of the plate-like member, the groove is formed in the table body along the periphery of the suction face.

Also, it is preferred to adopt such an arrangement that a plurality of the grooves are formed along the direction from the center of the suction face to the periphery thereof at predetermined intervals.

Further, it is possible to adopt such an arrangement that, on the other surface of the plate-like member, a protection tape, which can be peeled off via a strip-shaped peeling tape, is stuck, the extending length of the groove is arranged to be larger than the shorter width of the peeling tape.

Furthermore, the present invention may adopt such an arrangement that a suction unit used for an apparatus for peeling off a protection tape stuck on the upper face of a wafer supported by a ring frame by means of a dicing tape, comprising:

a table having a suction face for sucking the dicing tape by performing a predetermined suction to hold the wafer, wherein a groove is formed at least in a partial area along the periphery of the wafer.

Effect of the Invention

According to the present invention, when the suction is performed through the suction face to suck the adhesive sheet, the suction flow is generated from a gap between the adhesive sheet and the groove at the outer side of the suction face towards the suction face. Owing to this suction, the pressure within the internal space of the groove is reduced, and the adhesive sheet overlapping a groove sinks downwards into the groove. Accordingly, for example, the protection tape is stuck on the other surface of the plate-like member, and thereafter when the peeling tape for peeling the protection tape is stuck to the outer side edge of the protection tape by an elastically deformable roller, the adhesive sheet is kept away from the peeling tape due to sinking lower of the adhesive sheet; thus the protection tape and the adhesive sheet are prevented from unintentional adhering to each other. Owing to this arrangement, conventional structure for moving the mask plate and plate-like member is not required. Accordingly, the number of components can be reduced and simplification of the apparatus can be achieved. Furthermore, the moving operation of the mask plate to prevent the peeling tape from adhering to the adhesive tape can be eliminated. Thus, the necessary processing time for peeling off can be reduced.

In addition, the suction face has a plane shape corresponding to the plane shape of the plate-like member, and the groove is positioned along the periphery of the suction face. Accordingly, close positioning of the suction face and the groove to each other can help the pressure reduction of the groove by the suction effectively; thus, the adhesive sheet and the peeling tape can be prevented from adhering to each other more reliably.

Further, a plurality of grooves are formed along the direction from the center of the suction face to the periphery thereof. Even when holding plate-like members of various plane sizes, a groove can be located at a position along the periphery of the plate-like member corresponding to the size. Thus, the applicability of the suction unit is enhanced.

Furthermore, the extending length of the groove is arranged to be larger than the shorter width of the peeling tape. Accordingly, the adhesive sheet can be sunk across the full shorter width of the peeling tape. Thus, the adhesive sheet and the peeling tape can be prevented from adhering to each other more reliably and the peeling off of the protection tape can be carried out smoothly.

EXPLANATION OF CODES

Figure 1:
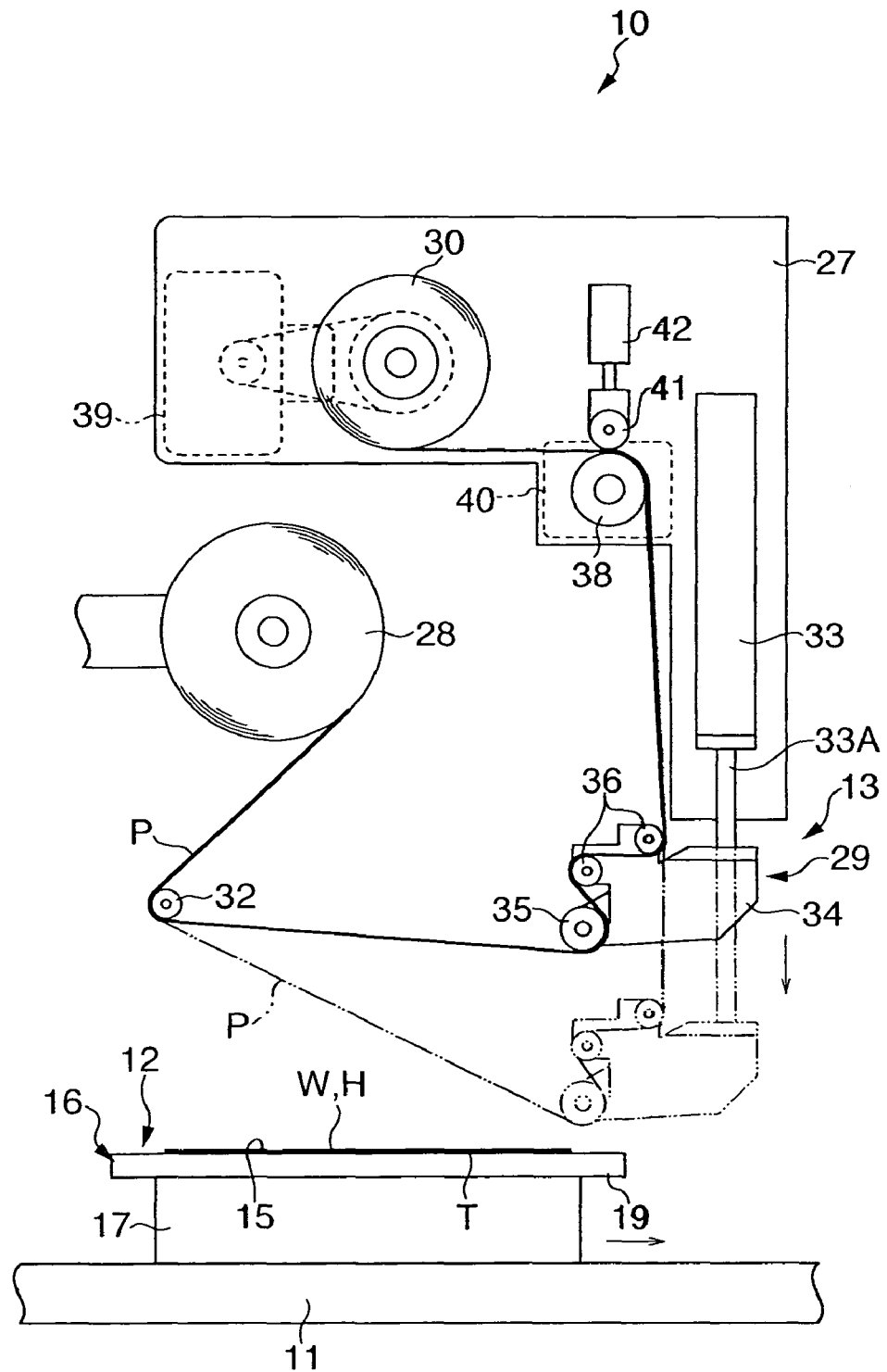
FIG. 1 is a schematic view showing the structure of a peeling unit to which a suction unit in accordance with a first embodiment is applied.

12 . . . suction unit
15 . . . suction face
16 . . . table
19 . . . table body
20 . . . suction member
24 . . . groove
44 . . . groove
H . . . protection tape
P . . . peeling tape
R . . . ring frame
T . . . dicing tape (adhesive tape)
W . . . wafer (plate-like member)

BEST MODE FOR CARRYING OUT THE INVENTION

Hereinafter, embodiments of the present invention will be described with reference to the drawings.

First Embodiment

FIG. 1 is a schematic view showing an arrangement of a peeling unit to which a suction unit in accordance with a first embodiment is applied. In FIG. 1, a peeling unit 10 includes a suction unit 12, which is supported movably by a slider 11 extending in the right/left direction in FIG. 1, and a peeling means 13 disposed above the suction unit 12.

Figure 2:
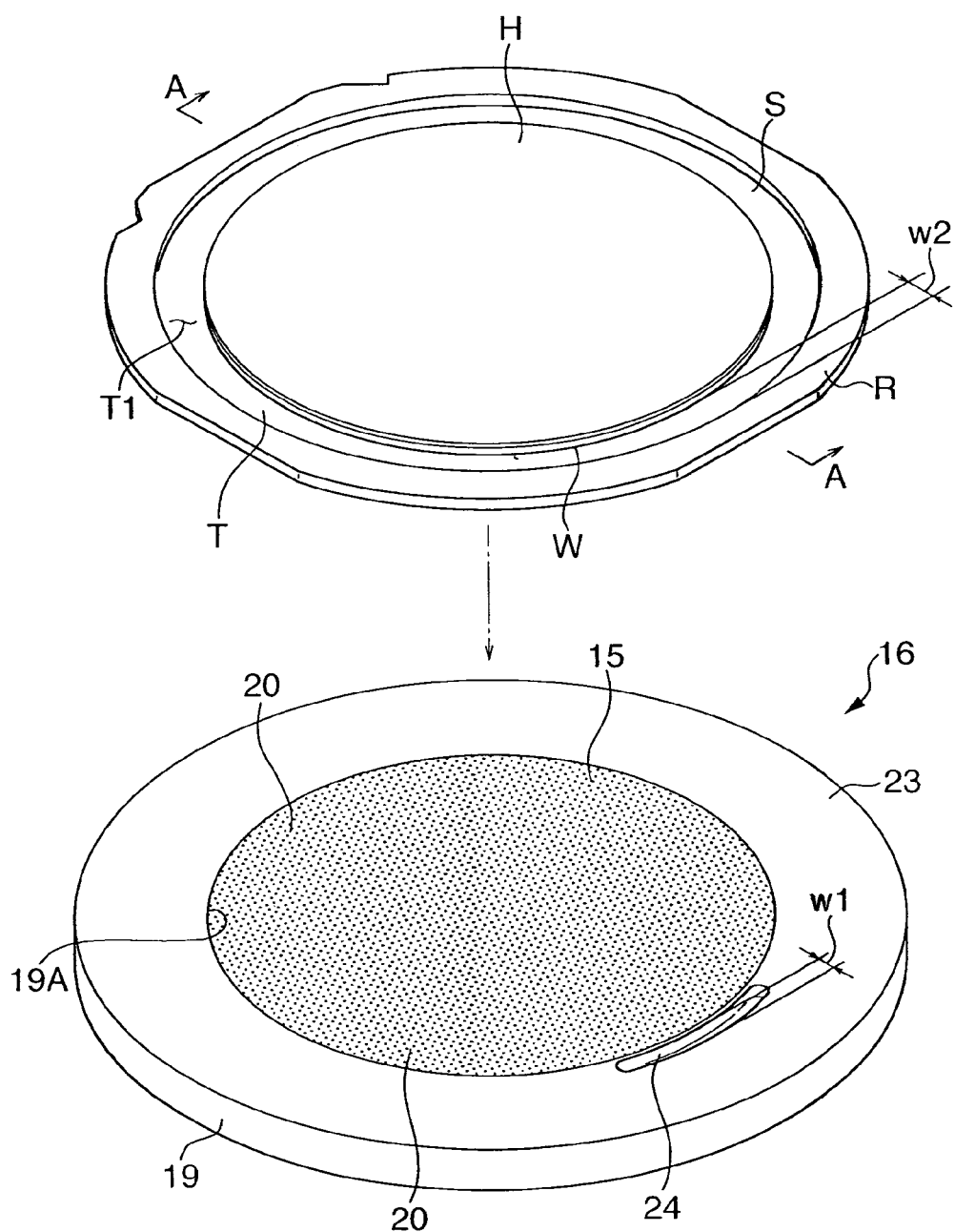
FIG. 2 is a schematic perspective view showing a table included in the suction unit and a wafer and the like, which are sucked thereby.
Figure 3:
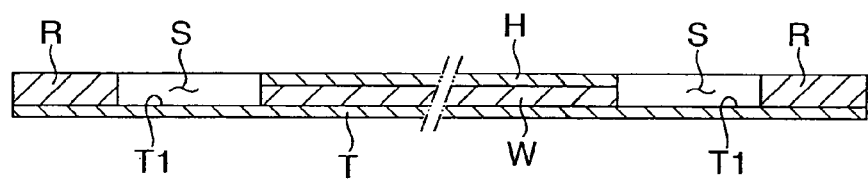
FIG. 3 is a sectional view taken along the line A-A in FIG. 2.

As shown in FIG. 2 and FIG. 3, a wafer W as a plate-like member, which is held by the suction unit 12, is formed in an almost disk-like shape, and is supported by a ring frame R via a dicing tape T as an adhesive sheet. Specifically, the dicing tape T has an adhesive face T1 on its upper face, and is stuck to the rear surface (bottom surface) of the wafer W via this face T1. The dicing tape T is formed in a plane area that is larger than the wafer W, and has a plane area protruding outside of the periphery of the wafer W, the periphery side of which is stuck to the bottom surface of the ring frame R. A substantially ring-shape space S is formed between the periphery of the wafer W and the inner periphery of the ring frame R, and adhesive face T1 of the dicing tape T is exposed from the space S. Meanwhile, a protection tape H is stuck on the front surface (upper face) of the wafer W. The protection tape H is cut along the periphery of the wafer W in the previous process, and is formed in a substantially identical configuration to that of the wafer W.

As shown in FIG. 1, the suction unit 12 includes a table 16 having a suction face 15 that sucks the dicing tape T on its upper face, and a support member 17 that supports the table 16 from the lower side. The support member 17 is attached to the slider 11 that is movable in the right/left direction.

Figure 4:
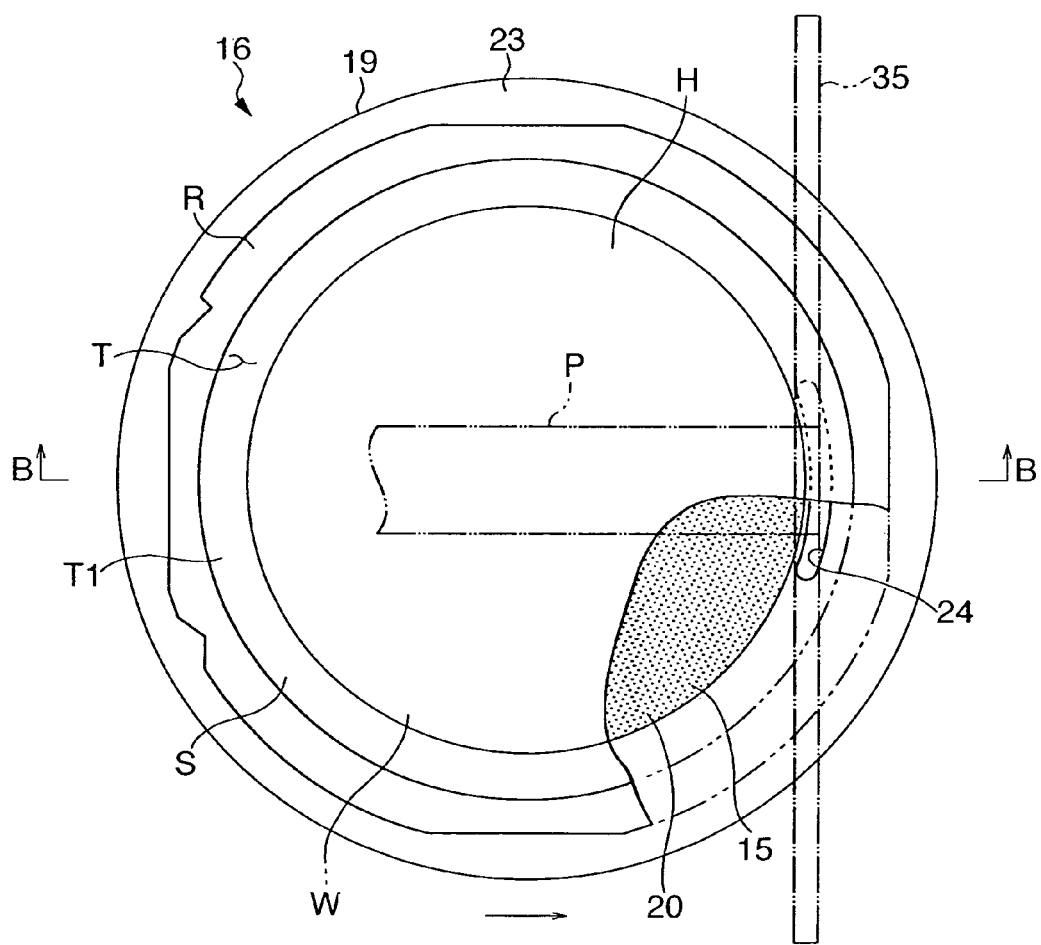
FIG. 4 is a plan view of the table.
Figure 5:
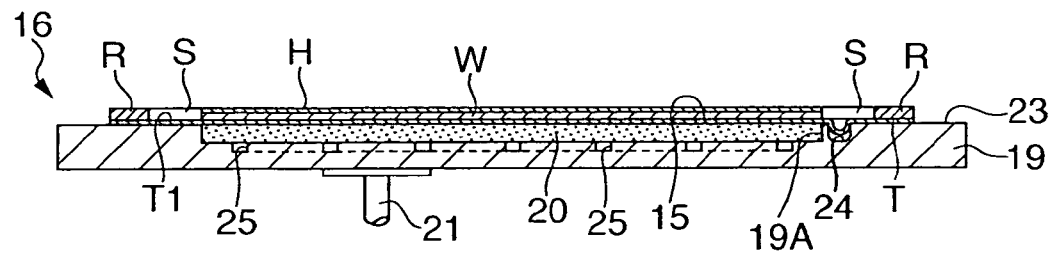
FIG. 5 is a sectional view taken along the line B-B in FIG. 4.

As shown in FIG. 2, FIG. 4 and FIG. 5, the table 16 includes a table body 19, which is formed in an substantially circular shape viewed from the top, and has a container-like configuration with a bottom including a hollowed portion 19A in the upper part, a suction member 20, which is formed of a porous material disposed within the area of the table body 19, i.e., inside of the hollowed portion 19A, and a hose 21 connected to the bottom face side of the table body 19. The suction member 20 is formed into a plane shape corresponding to that of the wafer W, i.e., a plane shape substantially identical to the shape of the wafer W, and the upper face thereof is formed as a suction face 15.

Figure 6:
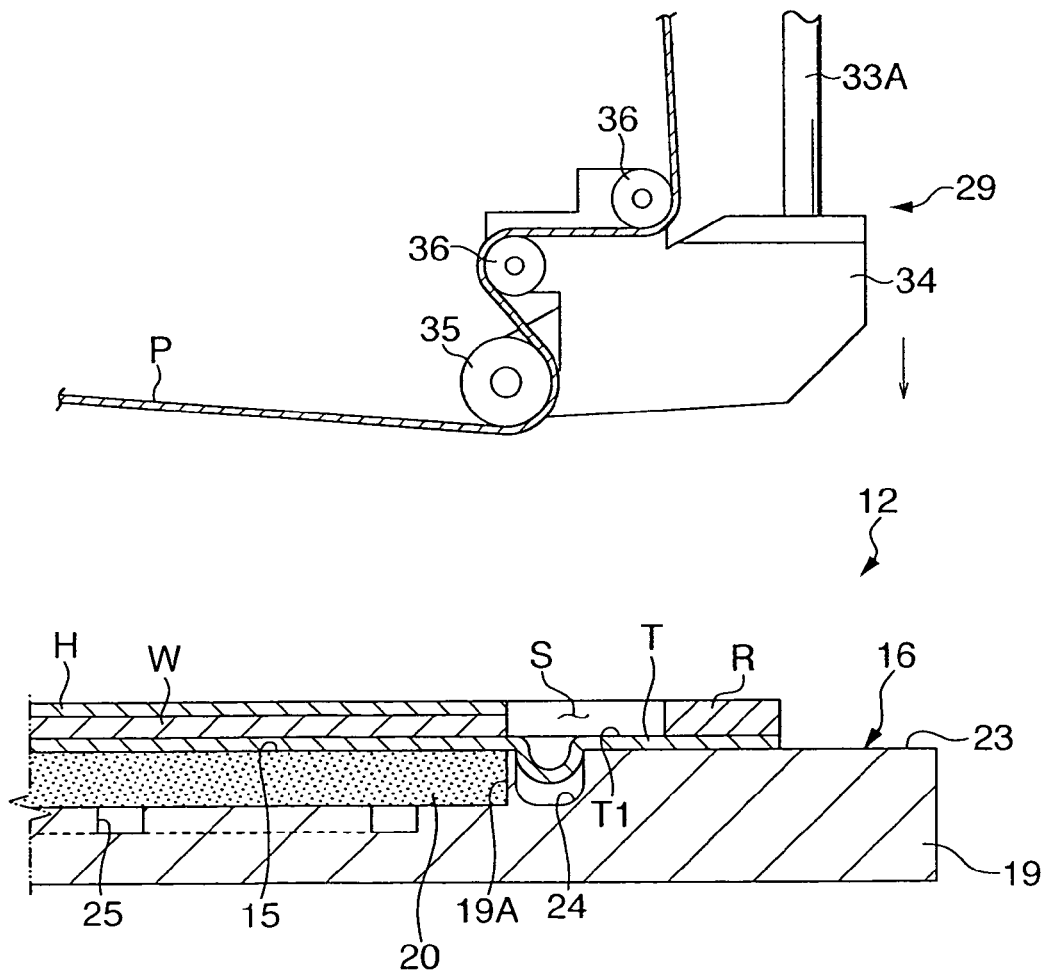
FIG. 6 is an enlarged view of a principal portion of FIG. 1, showing sectional view partially.

The table body 19 has an upper face area in a plane substantially identical to that of the upper face of the suction member 20, and the area forms a support face 23 that supports the dicing tape T protruding outside of the periphery of the wafer W and the ring frame R from the lower side. In the support face 23, a groove 24 adjacent to the right edge of the suction face 15 in FIG. 4 is formed having a small gap therefrom. The groove 24 is formed in a substantially arc-like shape viewed from the top extending along the periphery of the suction face 15, i.e., periphery of the wafer W. The position of the groove 24 is arranged so that the intermediate portion of the groove 24 in the peripheral extending direction is positioned at the most front side in the shifting direction of the suction unit 12; i.e., at the most right side in FIG. 4, when peeling the protection tape H. The extending length of the groove 24 is formed larger than the shorter width of the peeling tape P, which will be described later (refer to FIG. 4). On the other hand, the width w1 of the groove 24 (refer to FIG. 2) is arranged to be smaller than the width w2 of the space S along the radial direction of the wafer W. As shown in FIGS. 5 and 6, the groove 24 is formed in a substantially concave shape viewed in a section along the radial direction of the suction face 15.

Formed in the bottom of the hollowed portion 19A of the table body 19 is a plurality of air grooves 25, and these air grooves 25 communicate with the hose 21. Accordingly, when a decompression pump (not shown) connected to the hose 21 is activated, the air is sucked from substantially all area of the suction face 15 of the suction member 20 through each of the air grooves 25 to exert the suction force.

As shown in FIG. 1, the peeling means 13 is arranged so as to peel off the protection tape H from the wafer W using a peeling tape P, the surface of which facing to the protection tape H is the adhesive face. The peeling means 13 includes a support plate 27, which is disposed above the suction unit 12 and is formed in a substantially L-like shape viewed from the front thereof, a supply reel 28, which is disposed between the support plate 27 and the suction unit 12 to supply the peeling tape P, a pressurizing device 29, which is supported at the right side of the support plate 27 in FIG. 1 to pressurize the peeling tape P paid out from the supply reel 28 against the protection tape H, and a winding reel 30, which is supported at the left upper portion of the support plate 27 in FIG. 1 to wind the peeling tape P, which has passed through the pressurizing device 29.

The peeling tape P paid out from the supply reel 28 is laid around the pressurizing device 29 through a guide roller 32 disposed below the supply reel 28. The pressurizing device 29 includes a cylinder 33 oriented to the vertical direction, a holding member 34, which is connected to the rod 33A of the cylinder 33 and movable in the vertical direction, and a pressurizing roller 35, which is supported rotatably below the holding member 34 and on which the peeling tape P extending from the guide roller 32 is laid around. The holding member 34 is provided with two rollers 36, 36 above the pressurizing roller 35. It is arranged so that the peeling tape P, which is laid around the pressurizing roller 35 through these rollers 36, 36, is guided upward.

The peeling tape P laid around the pressurizing device 29 goes through between a drive roller 38 and a pinch roller 41 and wound by the winding reel 30. The drive roller 38 is driven by the motor 40 supported by the support plate 27 and located in the rear face side thereof. The pinch roller 41 pinches the peeling tape P by means of a cylinder 42. The winding reel 30 is provided to be rotatably via a motor 39 located in the rear face side of the support plate 27. The motor 40 imparts the pay out force of the peeling tape P from the supply reel 28 to the winding reel 30, and it is controlled so that the motor 39 winds the peeling tape P paid out therefrom.

Next, the sequence of peeling off the protection tape H by the peeling unit 10 will be described.

Figure 9:
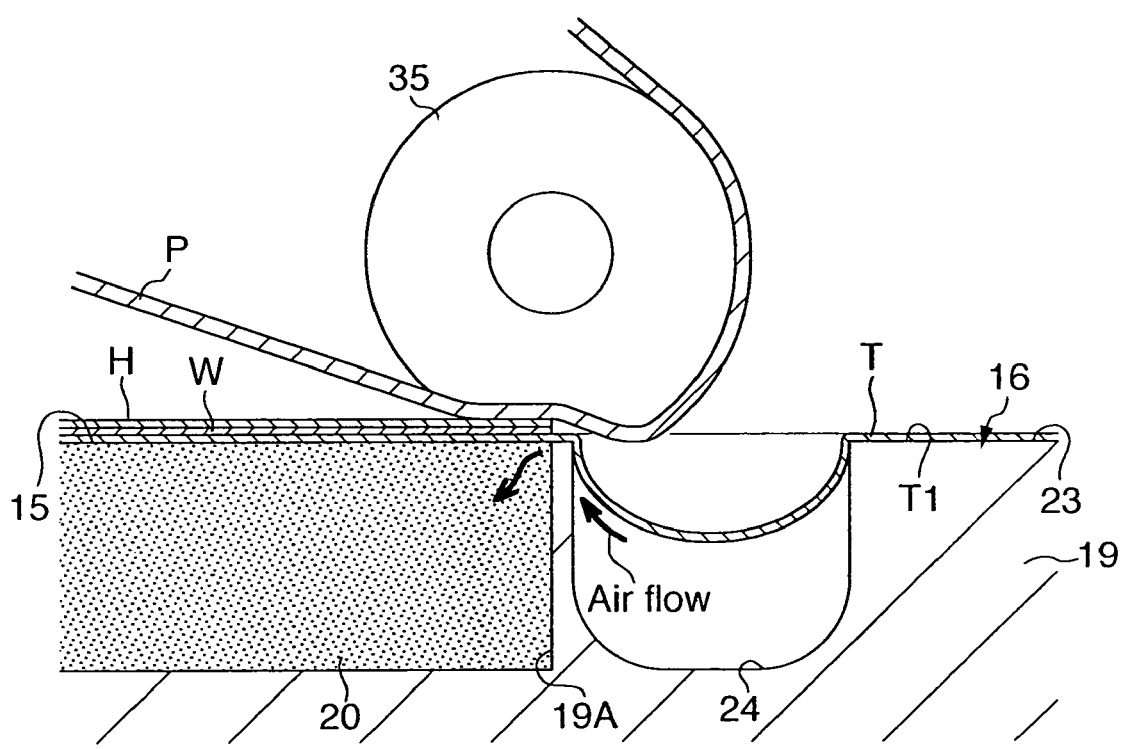
FIG. 9 is an illustrating diagram showing enlarged portion of a part of FIG. 7

First of all, a wafer W is placed on the table 16 by an unshown mounting unit so that the periphery of the wafer coincides substantially with the periphery of the suction face 15 in a state shown in FIG. 2. Then, a decompression pump (not shown) is activated to carry out the suction through the suction face 15 to suck the dicing tape T on the suction face 15 to hold the wafer W. Here, the air is sucked in the suction face 15 through the support face 23 and the dicing tape T, and at the same time, the air within the groove 24 along the suction face 15 is also sucked. While the groove 24 is closed at the top by the dicing tape T, the internal air is sucked. Accordingly, the inside of the groove 24 becomes negative pressure; and as shown in FIGS. 5, 6 and 9, the dicing tape T sinks in the groove 24, and the sinked state is maintained while the suction is carried out.

Figure 7:
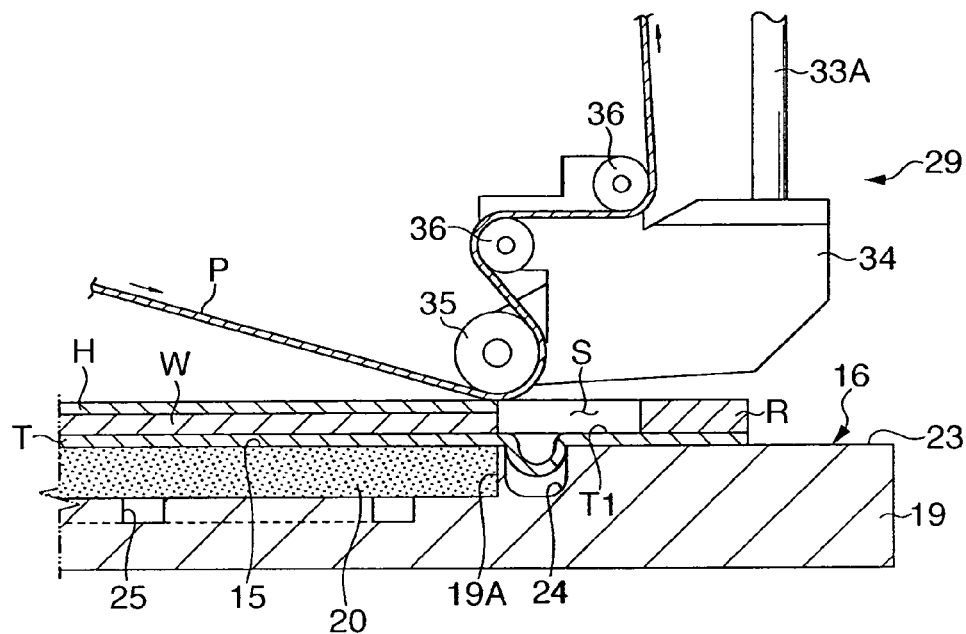
FIG. 7 is an enlarged view showing an initial state that a protection tape is peeled off from the wafer, in a similar way as in FIG. 6.

After the dicing tape T is sucked on the suction face 15 of the suction unit 12, the suction unit 12 is moved along the slider 11. And as shown in FIG. 6, as soon as the peripheral edge portion of the wafer W adjacent to the groove 24 (right end portion in FIG. 6). reaches a point substantially right below the pressurizing roller 35 of the pressurizing device 29, the movement of the suction unit 12 is stopped. Then, as shown in FIG. 7, the pressurizing roller 35 is moved downward by the rod 33A of the cylinder 33 to bring the peeling tape P laid around the pressurizing roller 35 into contact with the protection tape H stuck on the wafer W. Owing to this, the adhesive face of the peeling tape P adheres to the peripheral edge portion (right end portion in FIG. 6) of the protection tape H, the dicing tape T overlapping with the groove 24 sinks to retreat from the peeling tape P. Therefore, even if a pressurizing roller 35 is deformable elastically, undesirable sticking of the peeling tape P and the dicing tape T each other is prevented (refer to FIG. 9).

Figure 8:
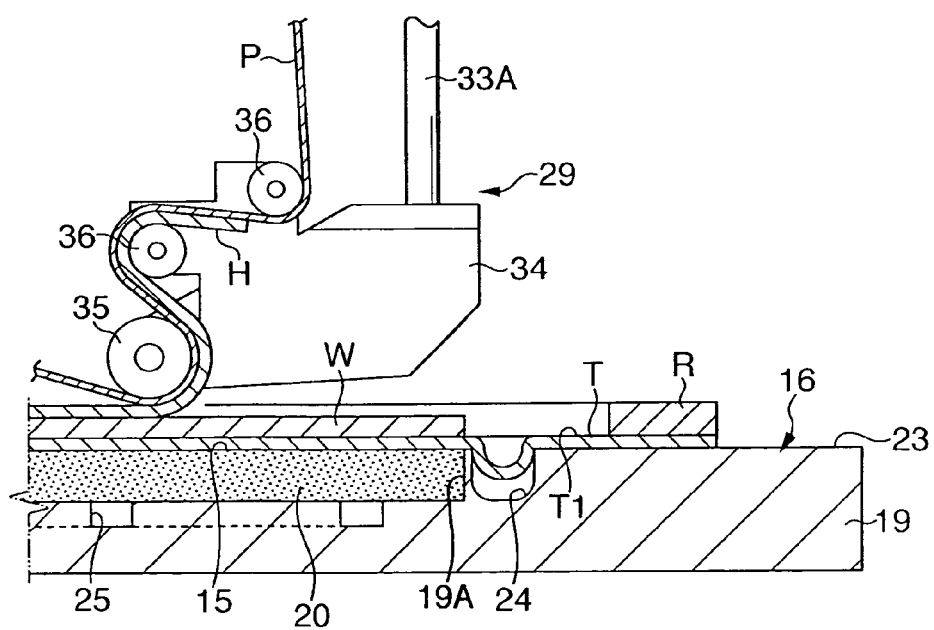
FIG. 8 is an enlarged view showing an intermediate state that a protection tape is peeled off from the wafer, in a similar way as in FIG. 6.

Then, the suction unit 12 is moved rightward in FIG. 7 by the slider 11, and the drive roller 38 is activated to pay out the peeling tape P in the direction of the arrowhead in FIG. 7. Here, the travel speed of the suction unit 12 and the pay-out speed of the peeling tape P are controlled so as to be substantially identical to each other. Owing to this, as shown in FIG. 8, the pressurizing roller 35 sticks the peeling tape P to the protection tape H along the radial direction thereof, while rotating on the protection tape H; and the protection tape H is wound by the pressurizing roller 35 together with the peeling tape P being stuck thereto. Thus, the protection tape H is gradually peeled off from the wafer W.

Therefore, according to the first embodiment as described above, such an extremely simple arrangement is employed that the groove 24 is formed on the table 16, and thereby, only ordinary suction process on the suction face 15 is sufficient to make the dicing tape T sink to prevent sticking to the peeling tape P. Thus peeling off of the protection tape H can be carried out smoothly.

Second Embodiment

Next, a second embodiment of the present invention will be described. In the following description, as for the identical or equivalent portions to those in the first embodiment, the same reference codes will be used, if necessary, and the description thereof will be omitted or made just simply.

Figure 10:
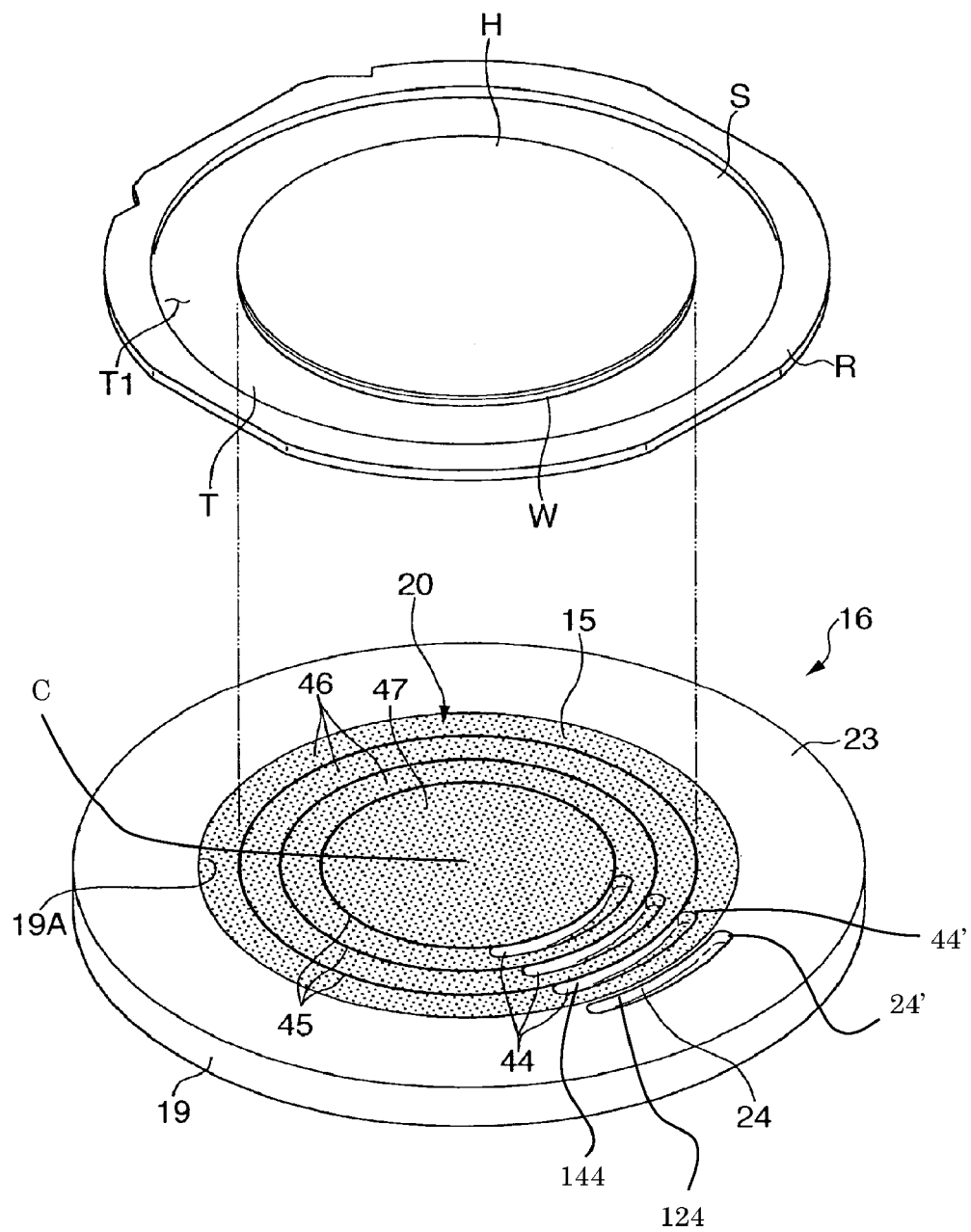
FIG. 10 is a perspective view of a table included in a suction unit in accordance with a second embodiment and a wafer and the like, which are sucked thereby, identical to that shown in FIG. 2.
Figure 11:
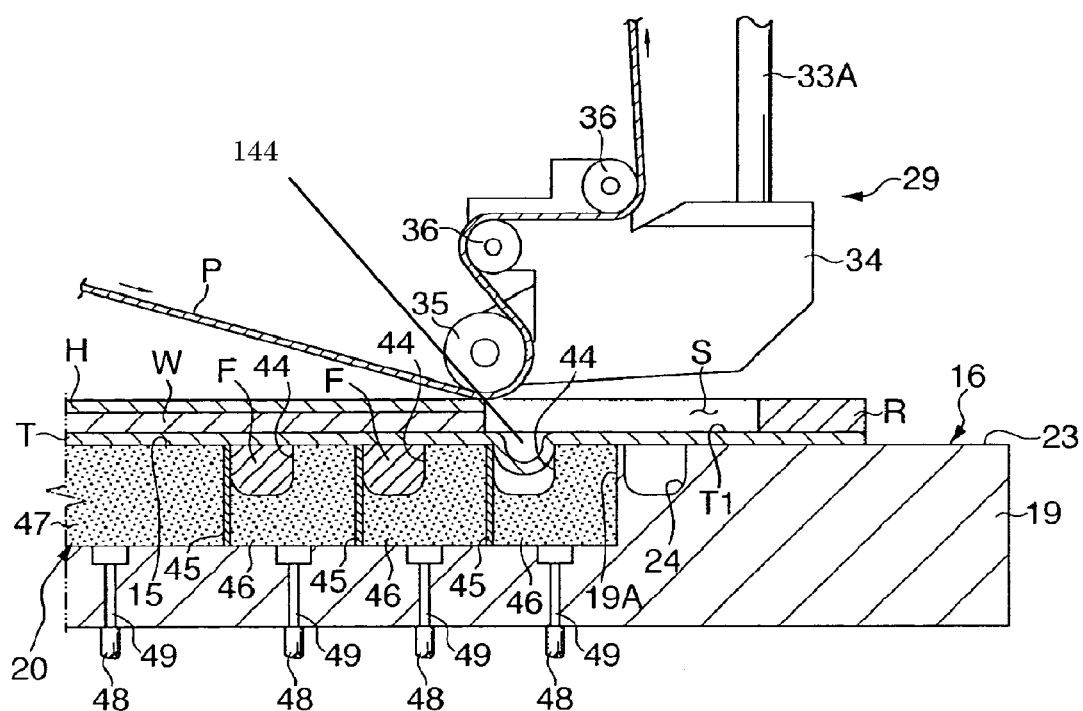
FIG. 11 is an enlarged view of the peeling unit in accordance with the second embodiment, in a similar way as in FIG. 7.
Figure 11:
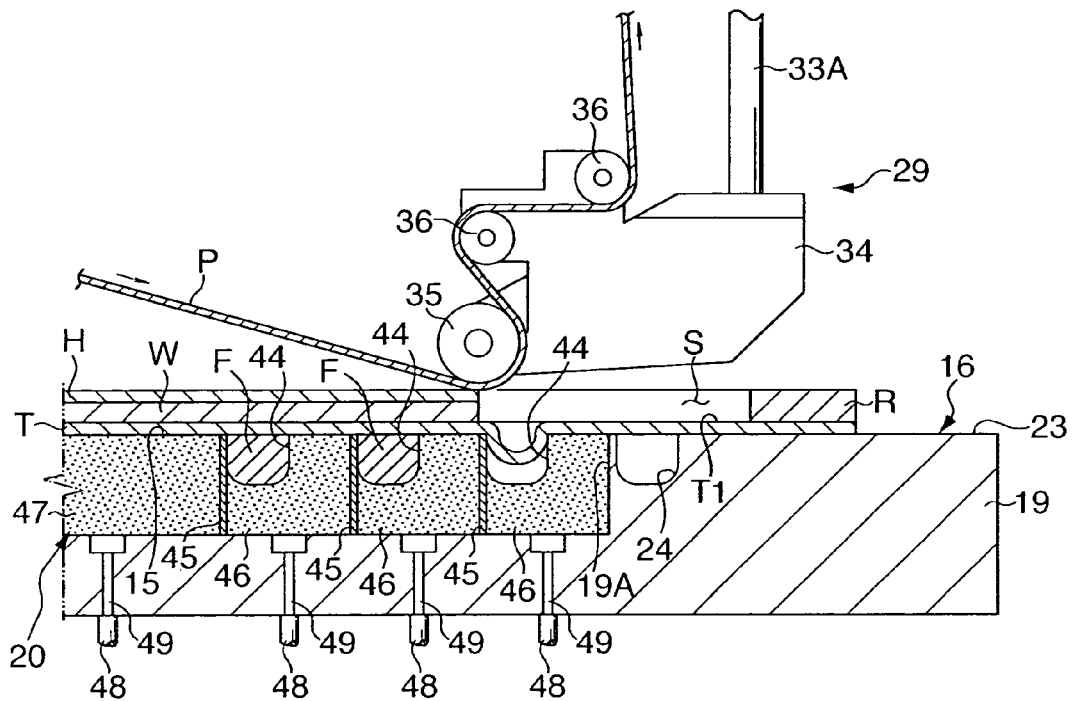
Figure 12:
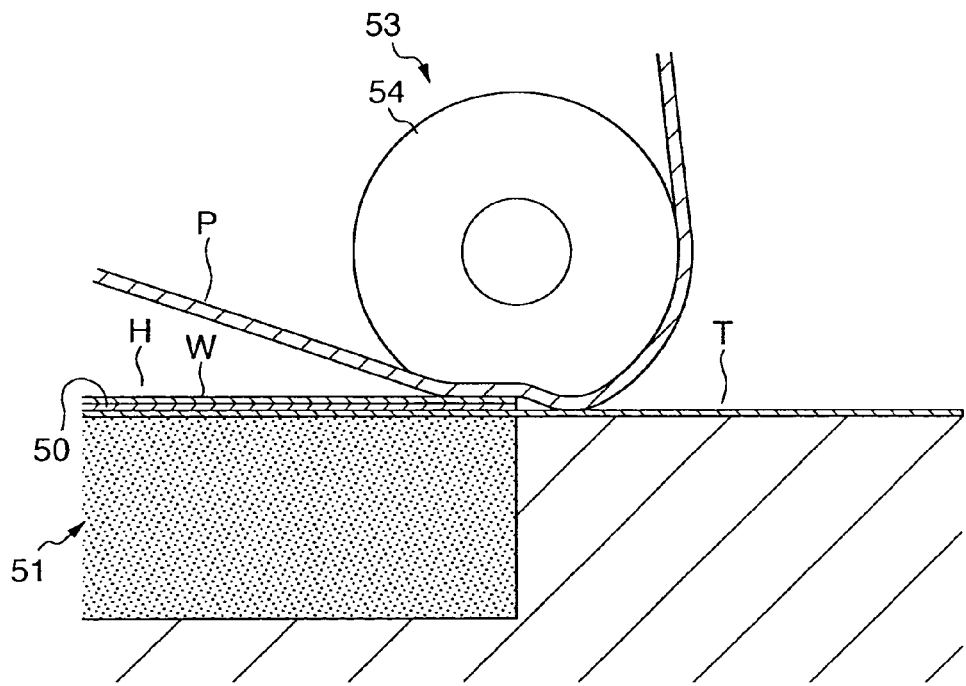
FIG. 12 is an illustrating diagram in accordance with a conventional art in a similar way as in FIG. 9.

FIG. 10 and FIG. 11 show a suction unit according to a second embodiment of the present invention. The second embodiment is characterized in that a plurality of grooves 44 are formed within the suction face 15 in the first embodiment.

In the suction member 20 according to the second embodiment, three partitioning walls 45 positioned substantially concentrically with respect to the periphery of the suction face 15 are formed. These partitioning walls 45 partition the suction member 20 into three ring members 46, which have a doughnut-like shape respectively viewed from the top, and a disk member 47, which is positioned inside the partitioning wall 45 at the most inner side. The plane shape of each partitioning wall 45 is arranged to be substantially identical to the plane shape of the various wafers W having different diameter dimensions respectively. Here, each of the ring members 46 has the groove 44 along the periphery of the respective partitioning walls 45. These grooves 44 and the groove 24 are positioned at predetermined intervals along the direction from the center of the suction face 15 to the periphery thereof; i.e., in the radial direction of the suction face 15. The grooves 44 formed in each of the ring members 46 are arranged to have substantially identical extending length and width to those of the groove 24.

As shown in FIG. 11, the grooves 44 that are covered by the wafer W, are replenished by a filling member F to be substantially even with the suction face 15. The filling member F is fitted detachably in the grooves 44. Thus, it is arranged so that, when the wafer W is held on the suction face 15, the bottom surface of the wafer W in FIG. 11 is prevented from being damaged by the edge formed by the groove 44.

As shown in FIG. 11, suction holes 49 connected to the hose 48 are formed below each of the ring members 46 and the disk member 47 of the table body 19 respectively. Each of the hoses 48 is connected to a decompression pump via an unshown solenoid valve. By controlling the solenoid valve to open/close, the suction operation of the ring members 46 and the disk member 47 can be controlled independently. The partitioning walls 45 block the airflow between the neighboring ring members 46 and the disk member 47.

In the arrangement as described above, for example, in the case where a wafer W having a shape substantially identical to the plane shape of the outermost partitioning wall 45 as shown in FIG. 10 is sucked, first of all, the filling member F is fitted in the grooves 44 covered by the wafer W (refer to FIG. 11). And the outermost ring member 46 is excluded from sucking through the solenoid valve (not shown) control, but the suction is carried out in the other ring members 46 and disk member 47 except the one above.

In this state, such a wafer W, as shown in FIG. 10, that the periphery of the wafer W substantially coincident with the outermost partitioning wall 45 is placed on the table 16. Owing to this, the ring member 46 and the disk member 47 for suction suck the dicing tape T to hold the wafer W. At this time, same as the case of the groove 24 in the first embodiment, the air within the groove 44, which is formed in the outermost ring member 46 along the periphery of the wafer W, is sucked, and the dicing tape T sinks lower into the groove 44.

Note that the plane shape of the wafer W may be changed. For example, same as the case in the first embodiment, substantially the same size as that of the periphery of the suction member 20 may be adopted; or substantially the same size as that of the innermost partitioning wall 45 or the partitioning wall 45 located in the intermediate position may be adopted. In this case, if there are grooves 44 in the covered area by the wafer W, the filling member F are fitted therein, and the ring member 46, which is not covered by the wafer W, is controlled to stop suction. Thereby, corresponding to the various plane shapes of the wafer W, the dicing tape T can be sunk in the groove 44 along the periphery of the wafer W.

Therefore, according to the second embodiment as described above, even when the plane shape of the wafer W is changed, either of the grooves 24 and 44 is positioned along the periphery of the wafer W and causes the dicing tape T to sink. Owing to this, the same advantage as that in the first embodiment is obtained. And further, the applicability with respect to the plane shape of the wafer W is increased.

Best arrangement, method and the like for carrying out the present invention have been disclosed in the above description. However, the present invention is not limited to the above description.

That is, the present invention has been particularly illustrated and described mainly with respect to a specific embodiment. However, one skilled in the art can add various modifications to the above-described embodiments in detailed arrangement such as configuration, number, material and others without departing from the range of the technical idea and object of the present invention.

For instance, various design changes on the suction member 20 are possible. For example, the following arrangement may be adopted; i.e., many holes for carrying out the suction may be formed within the suction face 15.

Also, the position for forming the groove 24 is not limited to the illustrated example. For example, the groove 24 may be formed in a ring-like shape in the almost entire area along the periphery of the suction face 15 viewed from the top. Or, the groove 24 may be formed in a plurality of positions in the support face 23 of the table body 16; like that, the groove 24 may be formed at the both sides of sticking start portion and sticking end portion of the peeling tape P along the radial direction of the suction face 15.

Further, such a case that the dicing tape T is stuck to the ring frame R has been described. However, as far as the dicing tape T has such a plane shape as protruding outside of the periphery of the wafer W, the ring frame R may be omitted.

Furthermore, in the first embodiment, a small gap is provided between the suction member 20 and the groove 24. However, the groove 24 maybe formed without any gap.

Still further, in the second embodiment, the number of formations in terms of the grooves 44, partitioning walls 45 and ring members 46 may be changed, if necessary.

Still furthermore, there has been described a case in which the peeling of the protection tape H is carried out by moving the suction unit 12. However, such an arrangement may be adopted that the pressurizing roller 35 to which the peeling tape P is laid around is moved on the protection tape H. In other words, if the suction unit 12 and the pressurizing roller 35 are arranged so as to be relatively movable accompanying the payout operation of the peeling tape P, any arrangement is acceptable.

INDUSTRIAL APPLICABILITY

The present invention is applicable mainly to an apparatus, which peels off a protection tape stuck on a plate-like member such as wafer using a peeling tape.

The invention claimed is:
1. A suction unit to hold a plate member by sucking an adhesive sheet, comprising:
a table having a face side comprising having a suction face and a support face provided outside the suction face, the suction face being in a round shape with a center thereof;
an air groove provided in the table, the air groove sucking air from substantially all area of the suction face;

a first groove provided on the suction face, the first groove having a first looped periphery on the suction face to provide a first opening;

a second groove provided on the suction face, the second groove having a second looped periphery on the suction face to provide a second opening;

a third groove provided on the support face, the third groove having a third looped periphery on the support face to provide a third opening, wherein the first and third grooves are aligned in a concentric manner, a first radius from the center to the first groove being different from a second radius from the center to the third groove, wherein the first groove located under the plate member is filled with a filling member; wherein a plate member with the adhesive sheet is placed on the suction face, wherein the adhesive sheet is larger than the plate member to extend beyond the plate member, wherein a part of the adhesive sheet extended beyond the plate member covers the second or third opening without the filling member, wherein when the air groove sucks air, the adhesive sheet extending beyond the plate member is sucked in the second or third groove without the filling member.

2. The suction unit according to claim 1, wherein said table includes a table body having an area positioned on a surface substantially identical to the suction face and a suction member provided within the area of the table body to form said suction face, said suction face has a plane shape corresponding to the plane shape of the plate member, said second groove is formed in the table body along the periphery of the suction face.

3. The suction unit according to claim 1, wherein on the other surface of said plate member, a protection tape, which can be peeled off via a strip-shaped peeling tape, is stuck.

4. The suction unit according to claim 1, wherein the plate member is a wafer.

5. The suction unit according to claim 1, wherein each of the first groove and the third groove has an extending length with ends.

* * * * *